United States Patent [19]

Kirkpatrick

[11] 4,328,613

[45] May 11, 1982

[54] CONNECTOR LEAD INSERTION METHOD

[75] Inventor: Robert J. Kirkpatrick, Bridgewater, N.J.

[73] Assignee: Bell Telephone Laboratories, Incorporated, Murray Hill, N.J.

[21] Appl. No.: 134,512

[22] Filed: Mar. 27, 1980

[51] Int. Cl.³ .............................................. H05K 3/30
[52] U.S. Cl. ....................................... 29/837; 29/741; 29/845; 140/1
[58] Field of Search .................. 29/33 K, 33 F, 426.1, 29/426.4, 845, 741, 749, 751, 752, 754; 81/9.51; 140/1, 93 R, 147

[56] References Cited

U.S. PATENT DOCUMENTS

| | | | |
|---|---|---|---|
| 1,760,629 | 5/1930 | Brindle, Jr. | 140/147 X |
| 2,120,877 | 6/1938 | Uber | 140/147 X |
| 3,075,562 | 1/1963 | Jankowski | 140/1 X |
| 3,416,348 | 12/1968 | Carter, Jr. et al. | 29/827 R |
| 3,988,815 | 11/1976 | Petree . | |

Primary Examiner—Francis S. Husar
Assistant Examiner—Carl J. Arbes
Attorney, Agent, or Firm—Thomas Stafford

[57] ABSTRACT

Manual mounting of large high density lead insertion connectors (1) onto circuit boards (3) is achieved by simultaneously engaging all connector leads (2) with a comb (9), sliding the engaged leads into alignment with receiving passageways (4) in the circuit board and pressing the connector leads into the receiving passageways. The comb has an exterior surface forming channels (10) corresponding in spatial relationship to the lead receiving passageways. A connector lead insertion apparatus (5, 6, 7, 8, 9, 10) is utilized in conjunction with the lead insertion method to hold the circuit board and connector in fixed position with respect to each other. The apparatus further permits the comb to be guided into proper position prior to engaging the connector leads.

2 Claims, 7 Drawing Figures

CONNECTOR LEAD INSERTION METHOD

TECHNICAL FIELD

This invention relates to a method of mounting a high density lead insertion connector manually onto a circuit board compatible with the connector.

BACKGROUND OF THE INVENTION

Parallel communication between circuit boards is limited by the number of input and output connections available on each circuit board and corresponding connector. To meet demands for increased numbers of reliable input/output connections, circuit board connectors were redesigned to have a high connection or lead density and to be adapted for mounting directly on the circuit boards.

As lead density continued to increase, problems arose with respect to mounting high density lead insertion connectors onto circuit boards. Bent leads and other related defects caused by manufacturing or handling procedures heretofore rendered manual alignment and mounting of these connectors impractical, both physically and economically. Alternative techniques such as reflow soldering and appropriately designed high density connectors were developed to avoid the problems related to manual lead insertion.

SUMMARY OF THE INVENTION

Manual mounting of large high density lead insertion connectors onto circuit boards is achieved by simultaneously engaging all connector leads with a comb, sliding the engaged leads into alignment with receiving passageways in the circuit board and pressing the connector leads into the receiving passageways. The comb has an exterior surface forming channels to engage the connector leads. The channels correspond in spatial relationship to the circuit board passageways.

A connector lead insertion apparatus is utilized in conjunction with the lead insertion method. The insertion apparatus holds the circuit board and lead insertion connector in fixed position with respect to each other. The apparatus further permits the comb to be guided into proper position prior to engaging the connector leads. When the comb, circuit board and lead insertion connector are properly positioned in the insertion apparatus, the comb is slid toward the connector to engage simultaneously each of the connector leads in a corresponding individual channel of the comb. Pressure applied to the comb toward the receiving passageways causes the engaged leads to be slid into alignment with the passageways. A plate mounted on the apparatus is used to apply uniform pressure to the connector causing insertion of the engaged and aligned connector leads into the receiving passageways.

BRIEF DESCRIPTION OF THE DRAWINGS

A more complete understanding of the invention may be obtained by reading the following detailed description of a specific illustrative method embodying the invention in conjunction with the appended drawing in which.

DETAILED DESCRIPTION

FIGS. 1 and 3, 2 and 4, 5, and 6 depict a chronological sequence of steps in a method of manually mounting a large high density lead insertion connector onto a compatible circuit board.

Figure 1:
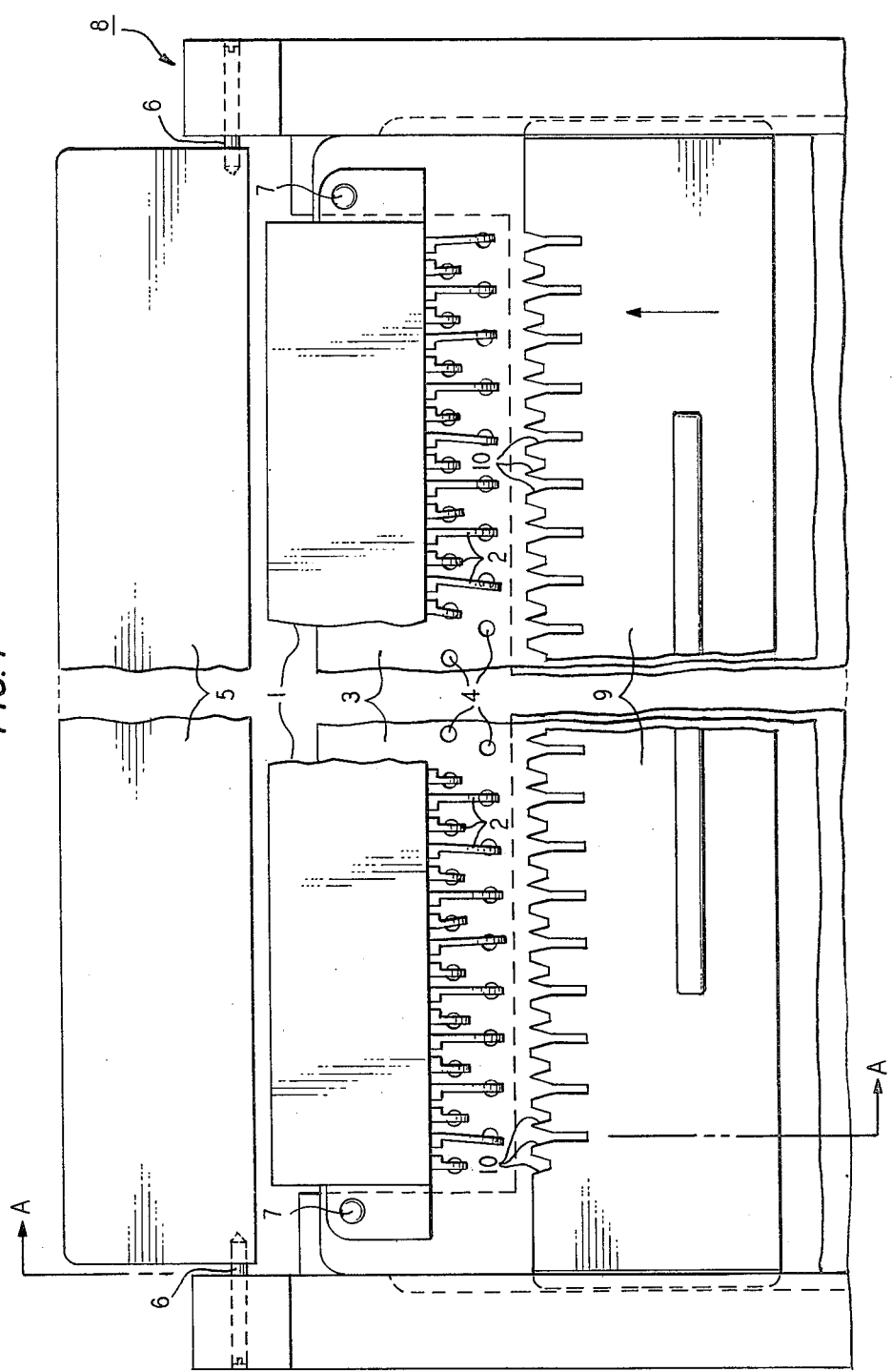
FIGS. 1 and 2 are top views of a lead insertion apparatus positioned for different steps in the method of mounting a lead insertion connector onto a circuit board.

Lead insertion connector 1 in FIG. 1 has plural leads 2 arranged in a predetermined spatial array. Leads 2 are an interface between connector pine (not shown) and circuit board 3. Plural lead receiving passageways 4 in circuit board 3 are disposed in an array corresponding to the array of leads 2. In an example from experimental practice, connector 1 is a large high density lead insertion connector having two tiers of leads 2 arranged along two rows offset from each other. Leads 2 in one row are set in spaces between leads 2 in the other row.

Lead insertion connector 1 is mounted onto circuit board 3 by using a manually operated connector lead insertion apparatus which includes pressure plate 5 pivotally mounted on axles 6, registration pins 7, support frame 8 and comb 9.

Figure 3:
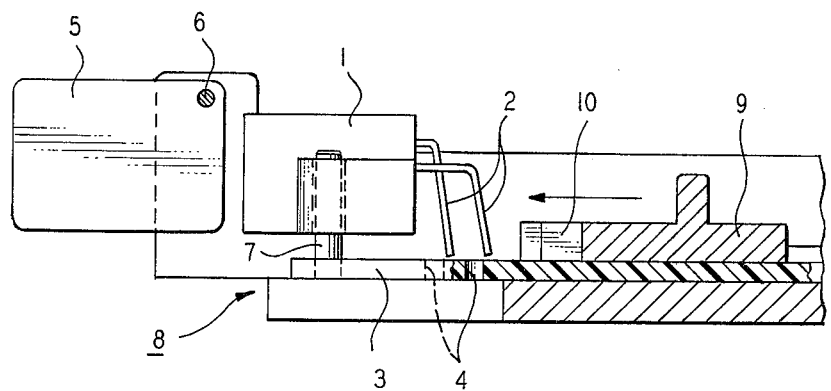
FIG. 3 is a fragmentary view of a portion of the lead insertion apparatus together with the connector and circuit board taken at cutting plane A—A in the direction shown by arrows in FIG. 1.

Both connector 1 and circuit board 3 have several registration holes to receive registration pins 7 extending from frame 8. When placed in support frame 8 on pins 7, connector 1 and circuit board 3 are registered with respect to each other. Registration insures that each lead 2 is matched with and substantially in the vicinity of each corresponding passageway 4. As illustrated in FIG. 1, several leads 2 are bent to one sie or another of passageway 4. Normally, leads 2 are on a side of passageway 4 which is closest to comb 9 as shown in FIGS. 1 and 3.

Comb 9 slides in grooves along sides of support frame 8. Channels 10 are formed along an exterior surface of a rectangular edge of comb 9 to receive and engage leads 2. Channels 10 correspond spatially with the disposition of passageways 4 for registered circuit board 3. Each channel 10 engages a corresponding lead 2 when comb 9 is slid toward connector 1. Outward fluting of each channel 10 allows comb 9 to engage individual leads 2 including any which are bent to either side of passageways 4 with respect to direction of movement of comb 9. As long as leads 2 are not excessively bent, each channel 10 engages and contains only one lead 2.

Figure 4:
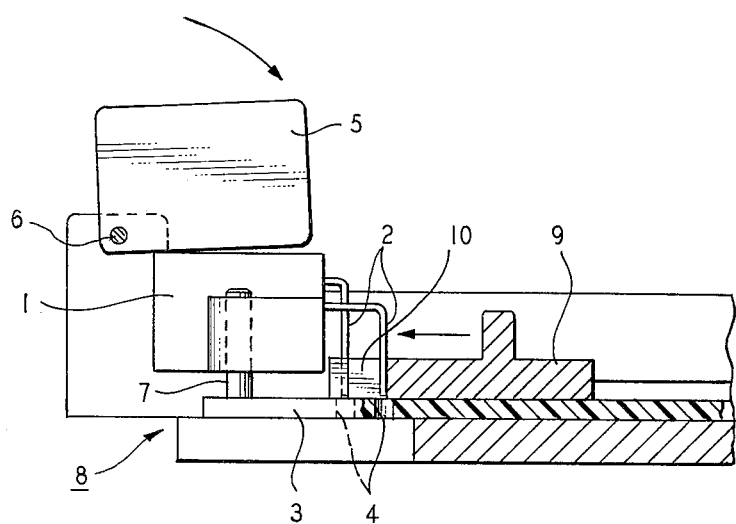
FIG. 4 is a fragmentary view of a portion of the lead insertion apparatus together with the connector and circuit board taken at cutting plane B—B in the direction shown by arrows in FIG. 2.

Upon contact with comb 9, leads 2 are confined simultaneously to corridors within corresponding passageways 4. A corridor is defined by the shape and dimensions of each channel 10. In the example illustrated in FIG. 1, each corridor is no wider than a widest opening at the end of fluted channel 10. Moreover, as engaged leads 2 are slid via comb 9 in unison toward passageways 4, each corridor tapers to a narrower width not less than the width of lead 2. Since channels 10 correspond in spatial orientation to the disposition of passageways 4, leads 2 engaged and slid in unison via comb 9 toward connector 1 come into alignment with passageways 4 as depicted in FIGS. 2 and 4.

Figure 2:
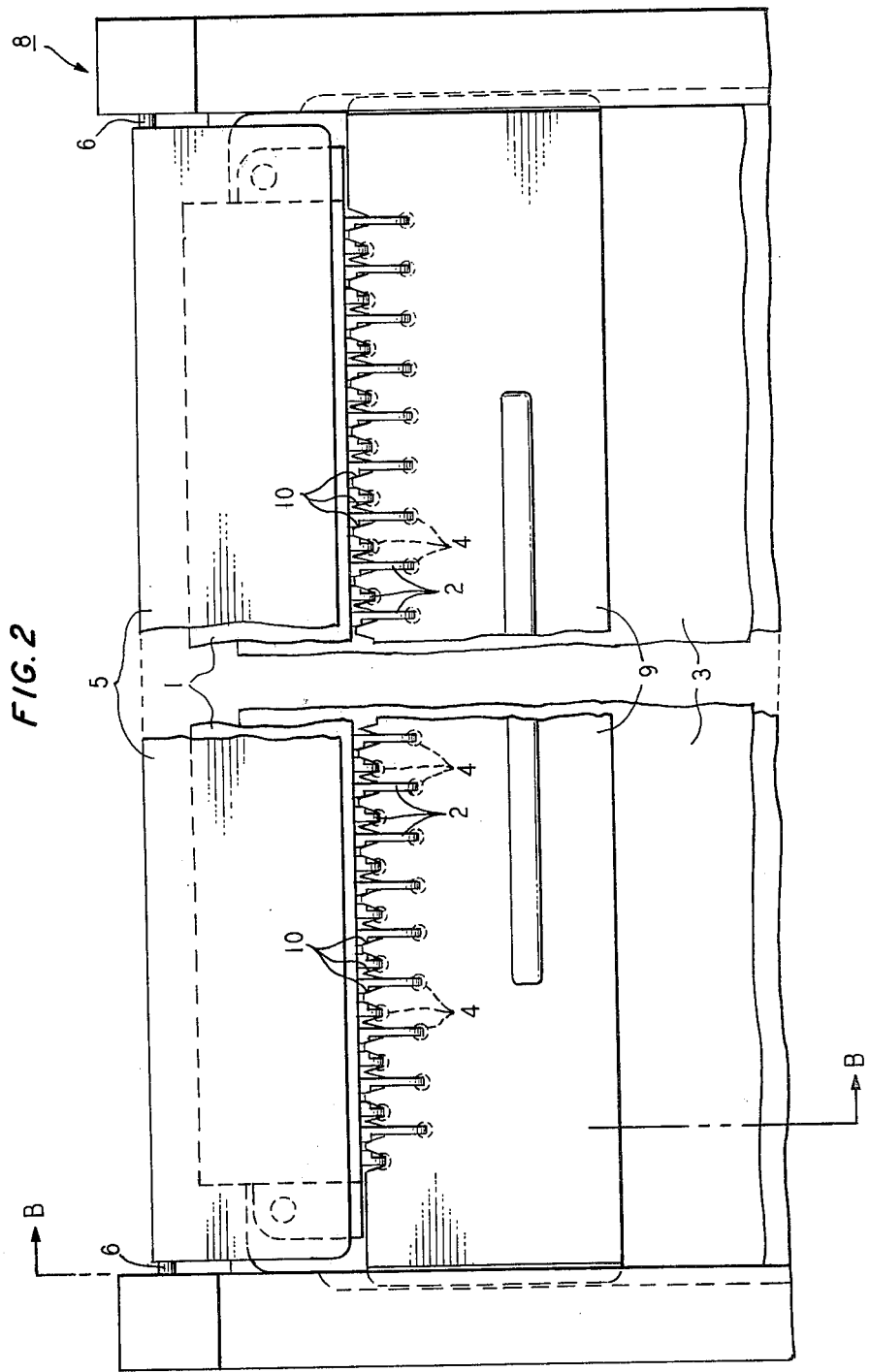

FIG. 2 shows leads 2 engaged and aligned by comb 9 over passageways 4. Leads 2, which were bent in FIG. 1, are now straightened in FIG. 2 by comb 9 and, in particular, channels 10.

Pressure plate 5 is pivotally mounted on axles 6 to allow rotation about an eccentric elongated axis of plate 5. As shown in FIG. 2, plate 5 is rotated over connector 1 in preparation for inserting aligned leads 2 into passageways 4. Plate 5 is used to apply a uniform pressure to connector 1 facilitating lead insertion.

FIG. 3 is a fragmentary section view through cutting plane A—A in FIG. 1. Connector 1 and circuit board 3 are positioned on registration pins 7. Leads 2 are shown touching circuit board 3 on the side of passageways 4 closest to comb 9. As comb 9 is slid toward connector 1, each channel 10 simultaneously contacts each corresponding lead 2 on at least one exterior surface located furthest from passageway 4. By also contacting a lower portion of each lead 2 on a surface proximate to circuit board 3, channel 10 holds each lead 2 substantially rigid. This facilitates alignment and insertion by eliminating the possibility of deforming leads 2 as they are guided in unison toward passageways 4.

Leads 2 engaged by comb 9 are slid toward and into alignment with passageways 4 as shown in FIG. 4. Pressure plate 5 is rotated onto connector 1. Uniform pressure is applied to connector 1 via plate 5 to insert aligned leads 2 into passageways 4.

Figure 5:
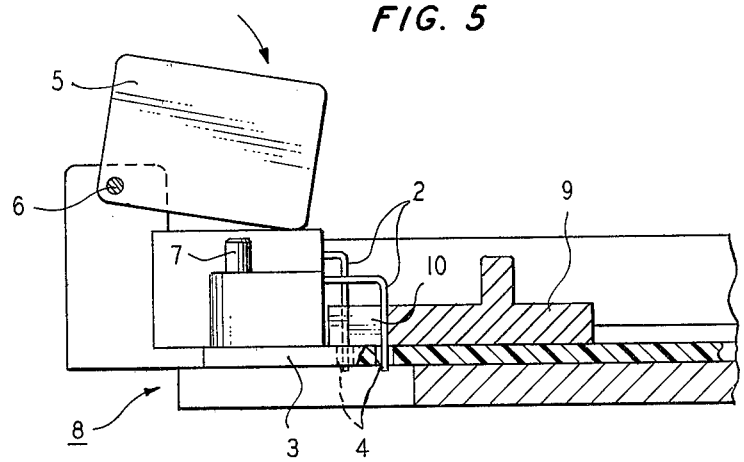
FIGS. 5 and 6 are fragmentary views of a portion of the lead insertion apparatus together with the connector and circuit board showing the method step of insertion taken at a cutting plane A—A in FIG. 1.

FIG. 5 is a fragmentary section view through a cutting plane similar to plane A—A in FIG. 1. Leads 2 have been inserted into passageways 4 by pressing on plate 5 in the direction of the arrow shown in FIG. 5. At this point, the manual mounting process of a large high density lead insertion connector onto a compatible circuit board is completed.

Figure 6:
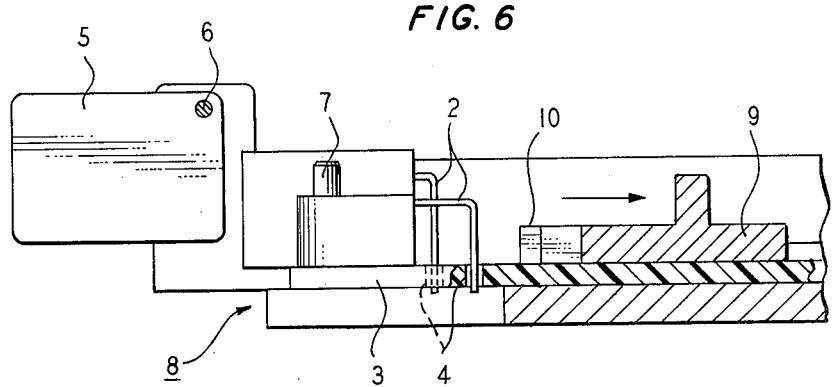
Figure 7:
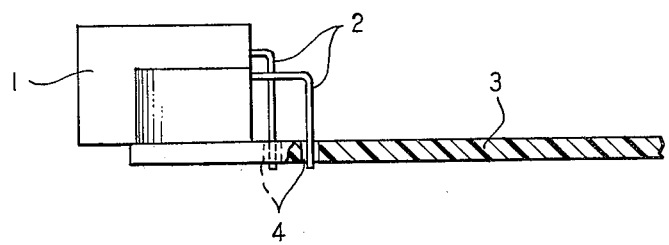
FIG. 7 is a fragmentary section of the lead insertion connector mounted on the circuit board.

FIG. 6 shows comb 9 being slid away from connector 1 to permit extraction of circuit board 3 and mounted connector 1. Also, pressure plate 5 is rotated away from connector 1. Then, connector 1 and circuit board 3 are removed from support frame 8. A fragmentary section view of connector 1 mounted on circuit board 3 is shown in FIG. 7.

Automation of the method described above may be accomplished by connecting pneumatic systems to pressure plate 5 and to comb 9. This and numerous other arrangements embodying the principles of the invention may be devised by those skilled in the art with departing from their spirit and scope.

I claim:

1. A method of mounting a lead insertion connector (1) having a plurality of leads (2) onto a circuit board (3) having a plurality of lead receiving passageways (4) corresponding to the plurality of leads, comprising the steps of:

engaging individual leads simultaneously with a single comb (9) having individual channels (10) corresponding in spatial orientation to the individual lead receiving passageways, contacting with said comb at least a portion of each lead on a surface located both furthest from the corresponding lead receiving passageway and proximate to the circuit board to hold that portion of each lead substantially rigid, sliding the plurality of engaged leads in unison toward and into alignment with the lead receiving passageways by uniplanar movement of the single comb parallel to the circuit board, and inserting the plurality of leads into the corresponding plurality of lead receiving passageways.

2. The method as defined in claim 1 wherein the engaging step includes the step of registering the connector and circuit board with respect to each other and wherein the inserting step includes the step of press fitting the connector to the circuit board by exerting uniform pressure thereon.

* * * * *